United States Patent [19]

Smith

[11] Patent Number: 5,587,680

[45] Date of Patent: Dec. 24, 1996

[54] PULSE GENERATOR WITH CHARGE PUMP

[75] Inventor: Stephen W. Smith, Raleigh, N.C.

[73] Assignee: MTS Systems Corporation, Eden Prairie, Minn.

[21] Appl. No.: 497,210

[22] Filed: Jun. 30, 1995

[51] Int. Cl.$^6$ .................................................. G06F 1/04
[52] U.S. Cl. ........................... 327/291; 327/110; 327/304
[58] Field of Search .................................... 327/110, 148, 327/157, 291, 300, 304, 390, 534, 535, 536, 589; 331/17, 57, 185

[56] References Cited

U.S. PATENT DOCUMENTS

| 4,734,599 | 3/1988 | Bohac, Jr. ............................... 307/497 |
| 4,979,088 | 12/1990 | Misaki et al. .............................. 363/60 |
| 4,991,583 | 2/1991 | Silvian ................................... 128/419 |
| 5,029,063 | 7/1991 | Lingstaedt et al. ....................... 363/60 |
| 5,043,858 | 8/1991 | Watanabe ................................. 363/61 |
| 5,095,223 | 3/1992 | Thomas .................................. 307/110 |
| 5,111,375 | 5/1992 | Marshall ................................. 363/60 |
| 5,258,662 | 11/1993 | Skovmand .......................... 307/296.3 |
| 5,306,954 | 4/1994 | Chan et al. ............................. 307/110 |

Primary Examiner—Timothy P. Callahan
Assistant Examiner—Jeffrey Zweizig
Attorney, Agent, or Firm—Kinney & Lange, P.A.

[57] ABSTRACT

A current pulse generator for generating current pulses on a conductor of controllable magnitude and duration based on a controlled pulse former. This pulse former is controlled by a controller in communication with a current sensor and operating a magnitude control signal generator as well as the pulse former, the magnitude signal generator also providing a selection signal to the pulse former.

23 Claims, 7 Drawing Sheets

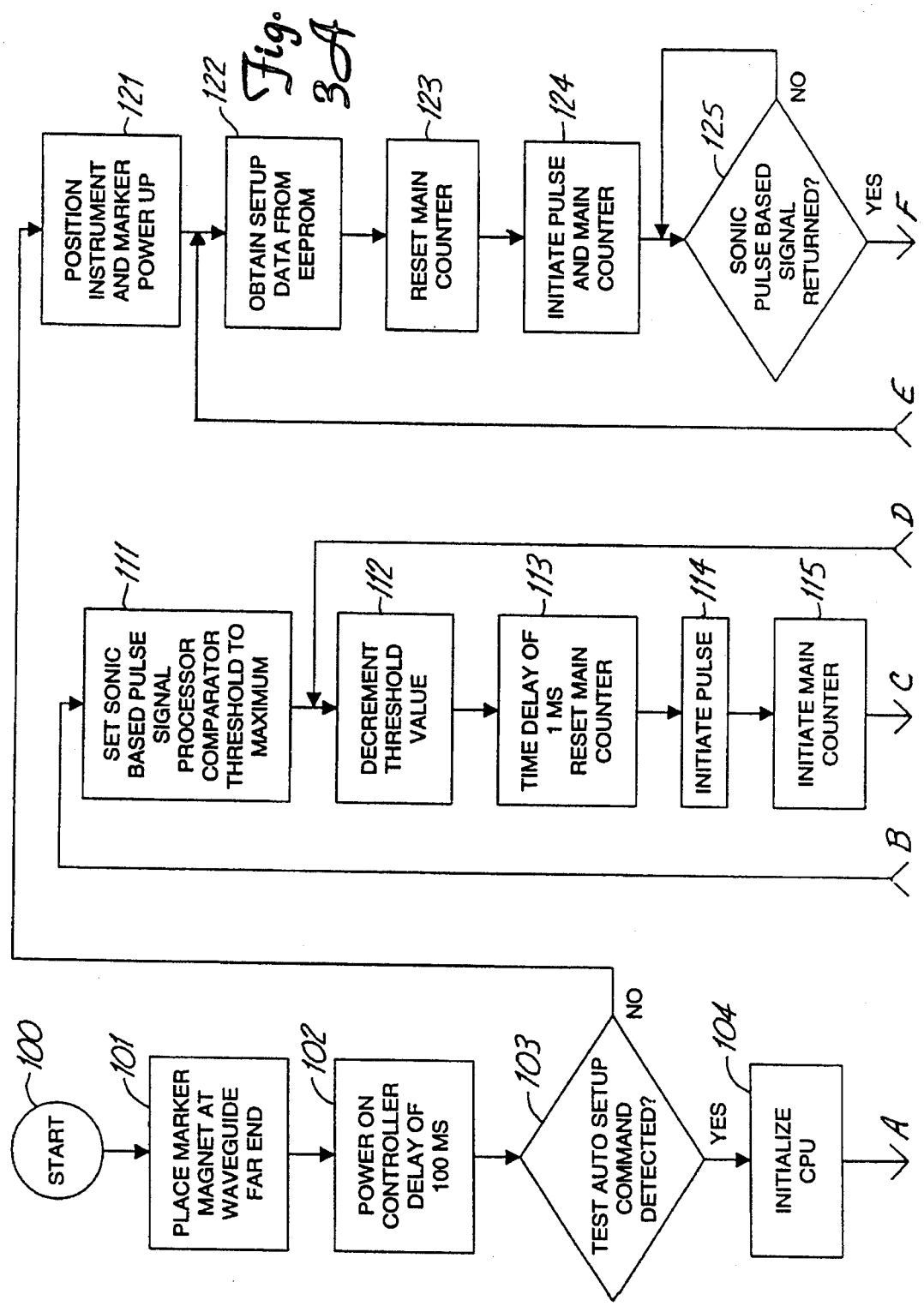

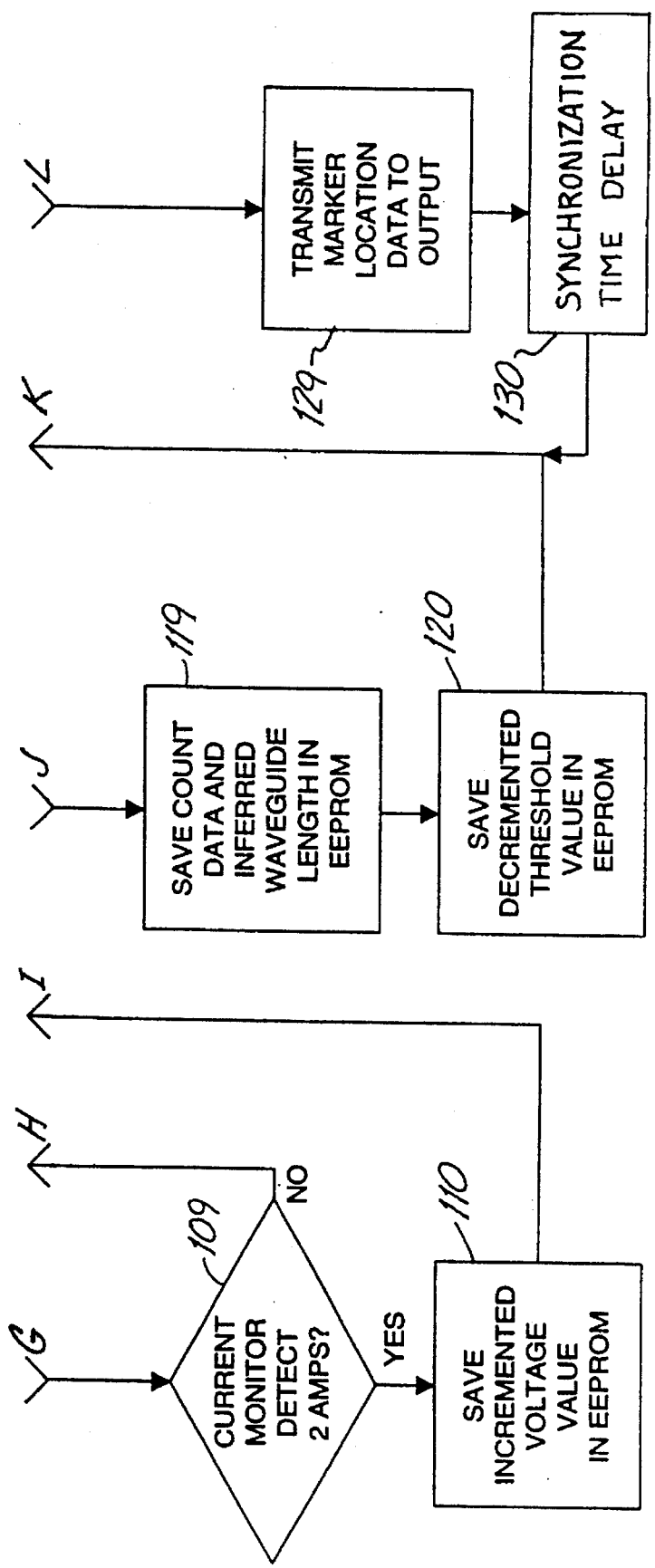

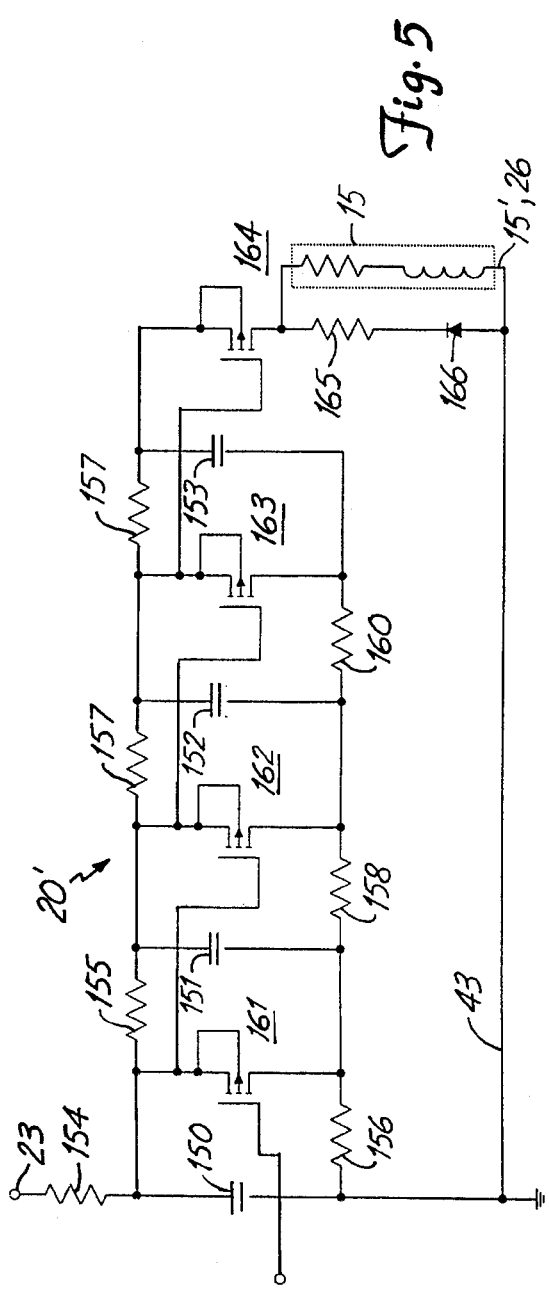
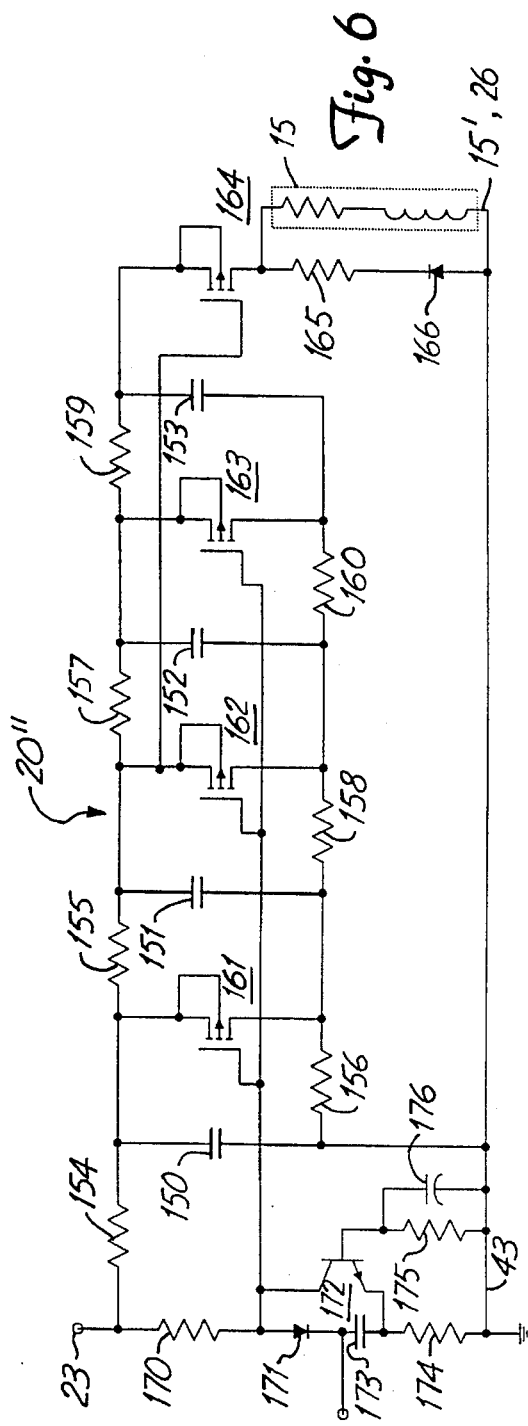

5,587,680

PULSE GENERATOR WITH CHARGE PUMP

BACKGROUND OF THE INVENTION

The present invention relates to circuits for pulses, and, more particularly, to generating electrical pulses of amplitudes greater than that of the electrical energy supply especially for forming current pulses for sonic waveguides.

Electrical pulses, that is, substantial changes in amplitude level of an electrical variable over a relatively short time, are needed to operate various electrical devices and perform various electrical functions. One such device is a sonic waveguide based relative translation distance measuring system, or instrument. In such systems, an electrical current pulse is applied through an electrical conductor wire encased in a ferromagnetic material waveguide tube or, alternatively, through a ferromagnetic material electrical conductor rod that also serves as the sonic waveguide. An external magnet, serving as a position marker by being guided along the tube to have a position therealong that is dependent on the distance to be measured, provides a magnetic field which interacts with the translating magnetic field established by the current pulse is applied through the wire or rod. That interaction results in a torque in the waveguide, whether tube or conductor, at the location of the interaction to thus provide a torsion pulse at that location in the sonic waveguide that is transmitted along that waveguide including back toward the source of the current pulse. The time duration between the imitation of the current pulse and the receiving of the sonic pulse reaching a sensing location at the sensing end of the waveguide is a measure of the distance to the variable position magnet from that location.

Such current pulses in the wire or guide in the relative translation distance measurement system are repeated frequently to provide a continual update of the position of the marker magnet, and so the distance thereto. The current pulse must be of sufficient magnitude to generate the necessary magnetic field for interacting with the magnetic field of the varying position marker magnet, but not excessive which would waste energy. In some situations, control of the pulse duration is also desired. Often, a voltage must be temporarily provided between the wire and the sonic waveguide tube or conductor rod to form the current pulse in the wire or rod which is larger than that available from the voltage supply locally available to the current pulsing circuit, although in some situations that voltage may be less than what is locally available. Thus, there is a desire for a current pulsing circuit which can provide a substantial electrical current pulse on a pulse carrying wire of a desired duration despite limits on the voltage supply available to the circuit, and which can provide such pulses at a suitable frequency.

SUMMARY OF THE INVENTION

The present invention provides a current pulse generation system for generating current pulses on an electrical pulse conductor of a selected magnitude and duration having a variable magnitude pulse former which can generate an output current pulse on this conductor of a magnitude determined by a magnitude controller connected thereto under the direction of a pulse controller which also initiates the occurrence of a current pulse from the pulse former. A current sensor provides a signal to the pulse controller indicating when the magnitude of the current pulse reaches a desired value as a basis for the controller terminating that pulse.

The pulse former can be formed from a plurality of interconnected circuit branches each having a capacitor therein in series with other impedance components. At least one of a plurality of switching devices is connected between two adjacent ones of these branches but on opposite sides of the capacitors in each. An energy recoverer can be used therewith.

BRIEF DESCRIPTION OF THE DRAWINGS

FIGS. 3A–3C show a flow chart for the operation of the system of FIG. 1;

FIG. 5 shows an alternative embodiment for a portion of the system shown in FIGS. 2 and 4; and FIG. 6 shows a further alternative embodiment for a portion of the system shown in FIGS. 2 and 4.

DETAILED DESCRIPTION OF THE PREFERRED EMBODIMENTS

Figure 1:
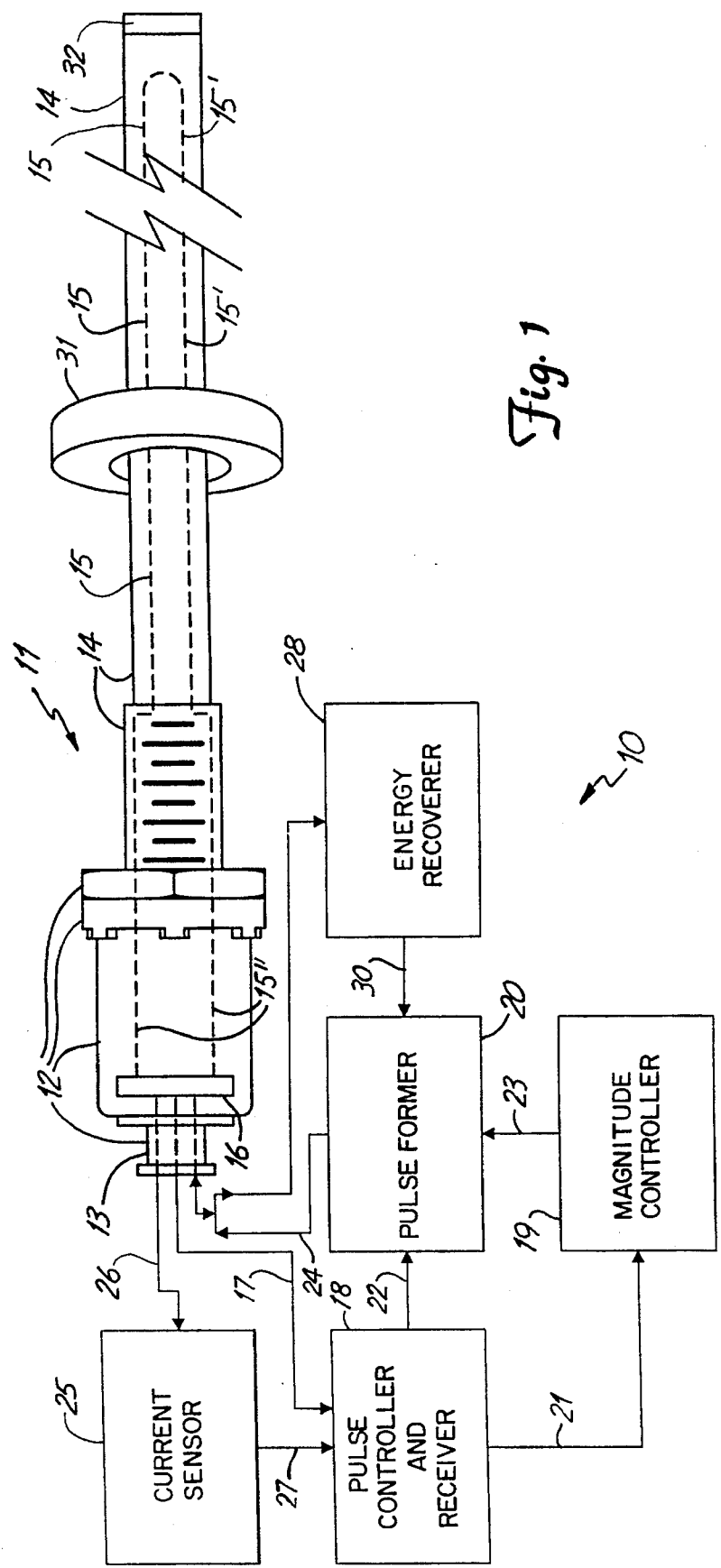
FIG. 1 shows a block diagram of a system embodying the present invention.

FIG. 1 shows in block diagram form a system or instrument, 10, for relative translation distance measurements based on a sonic waveguide. A transducer portion, 11, of system 10 includes an interface housing, 12, containing mechanical arrangements and portions of the electronic circuits used for providing electrical current pulses through a sonic waveguide, and for obtaining indications of returns of the corresponding torsion pulses initiated on that sonic waveguide. An electrical terminal arrangement or connector, 13, provides for various electrical terminals being available exterior to housing 12 to electrically connect the electronic circuits in housing 12 to other electronic circuit portions in system used to manage the operations occurring in transducer 11, and for extracting the desired information from the results of such operations.

An outer enclosure, 14, is used to enclose a sonic waveguide, 15, that is represented by one side of the long dashed-line loop shown extending through nearly all of enclosure 14 in FIG. 1 and into housing 12 of transducer 11. Enclosure 14 has a threaded portion on the end thereof at which housing 12 is provided, this threaded portion being engaged with a corresponding threaded portion in housing 12 so as to join them together in a unit.

Thus, sonic waveguide 15 is shown in highly representational form in FIG. 1 extending from somewhere in housing 12 to near the opposite end of enclosure 14 and, in practice, is typically in the form of a long rod-like structure of an electrically conductive and ferromagnetic material in the form described here, although it could be formed as a ferromagnetic tube in the alternative mentioned above having an electrical conductor positioned therein. A complete electrical circuit to carry electrical current pulses through sonic waveguide 15 is required, and so a return electrical conductor or wire, 15', is provided which also extends from somewhere in housing 12 to near the opposite end of enclosure 14 at which end it is electrically connected to the end of the rod serving as sonic waveguide 15. Return conductor 15' is also represented by a long dashed-line in FIG. 1 as the other side of the long dashed-line loop shown in enclosure 14.

Sonic waveguide 15 is mounted within housing 12, and has attached thereto magnetostrictive appendages which convert the returning torsion pulses to magnetic flux pulses which can be sensed in a mode converter to provide an output signal representing those pulses. In addition, of course, there must be an electrical connection to the waveguide rod in housing 12 to permit current pulses to be introduced thereon. None of this circuitry including the sensing arrangements is indicated in the structure shown in FIG. 1, but a general representation of the interconnections are given by the remainder of the long dashed-lines extending from sonic waveguide 15 and return conductor 15' that appear in housing 12 and are designated 15". These represent interconnections between both the sonic waveguide and the sonic waveguide torsion pulse sensing circuits mentioned above, on the one hand, and a printed circuit board, 16, on the other hand. Additional connections are also provided from printed circuit board 16 to the terminals provided for external connection through connector 13o Signals containing information as to the return on sonic waveguide 15 of torsion pulses are provided on an interconnection arrangement, 17, extending from connector 13 to a current pulse controller and torsion pulse signal receiver, 18, serving as the control arrangement for operating system 10. Typically, pulse controller and receiver 18 will be operated under the control of a microcomputer provided therein, although other control arrangements are possible.

Pulse controller and receiver 18 controls the magnitude and the times of occurrence of electrical current pulses initiated on waveguide 15 through directing operation of a magnitude controller, 19, and a pulse former, 20. An interconnection arrangement, 21, permits pulse controller and receiver 18 to provide command signals to magnitude controller 19, and a further interconnection arrangement, 22, allows pulse controller and receiver 18 to provide command signals to pulse former 20. Magnitude controller 19, under the direction of pulse controller and receiver 18, establishes the proper conditions in pulse former 20 over an interconnection arrangement, 23, to assure that electrical current pulses provided by pulse former 20 on waveguide 15 over an interconnection arrangement, 24, are of the desired magnitude on that waveguide.

Pulse controller and receiver 18 is aided in directing magnitude controller 19 to have pulse former 20 achieve this desired electrical current pulse magnitude by a current sensor, 25, which determines when that magnitude has been reached by current pulses in waveguide 15 through an interconnection arrangement, 26, extending from printed circuit board 16 through connector 13. Current sensor 25 provides the information as to the magnitude of the current pulse having become sufficient over a further interconnection arrangement, 27.

Because of the inductance exhibited by waveguide 15 during the transmission of electrical current pulses therethrough, a substantial amount of energy will be stored in the corresponding magnetic field. Upon the termination of an electrical current pulse, the magnetic energy in this field can in part be recaptured as the field disappears to thereby improve the efficiency of the system. This is accomplished by connecting waveguide 15 to an energy recoverer, 28, over an interconnection arrangement, 29. This recovered energy is supplied by energy recoverer 28 to pulse former 20 over a further interconnection arrangement, 30.

Although FIG. 1 shows pulse controller and receiver 18, magnitude controller 19, pulse former 20, current sensor 25 and energy recoverer 28 as subsystems external to transducer 11, this need not be the actual arrangement in practice. That is, all or portions of these subsystems can be provided within housing 12 if so desired. On the other hand, because of the external connections made available through connector 13, the subsystems need not be provided in housing 12 but could be provided at a location separated to some degree from transducer 11.

Also shown in FIG. 1 in connection with transducer 11 is a magnetic marker, 31, surrounding enclosure 14 in transducer 11 so as to be guided therealong by that enclosure. That is, marker 31 is free to move in the directions parallel to enclosure 14 during typical operation, not significantly in other directions. Magnetic marker 31 can be configured in many ways depending on the arrangement in which relative translation distance is to be measured, one possibility being having the marker former as a float with a magnet therein so as to permit it to represent the surface of a liquid in a tank. Many other alternatives for marker 31 are possible in applying the system of FIG. 1 to measuring relative translation distances in various settings. An end cap, 32, is used to close enclosure 14.

Figure 2:
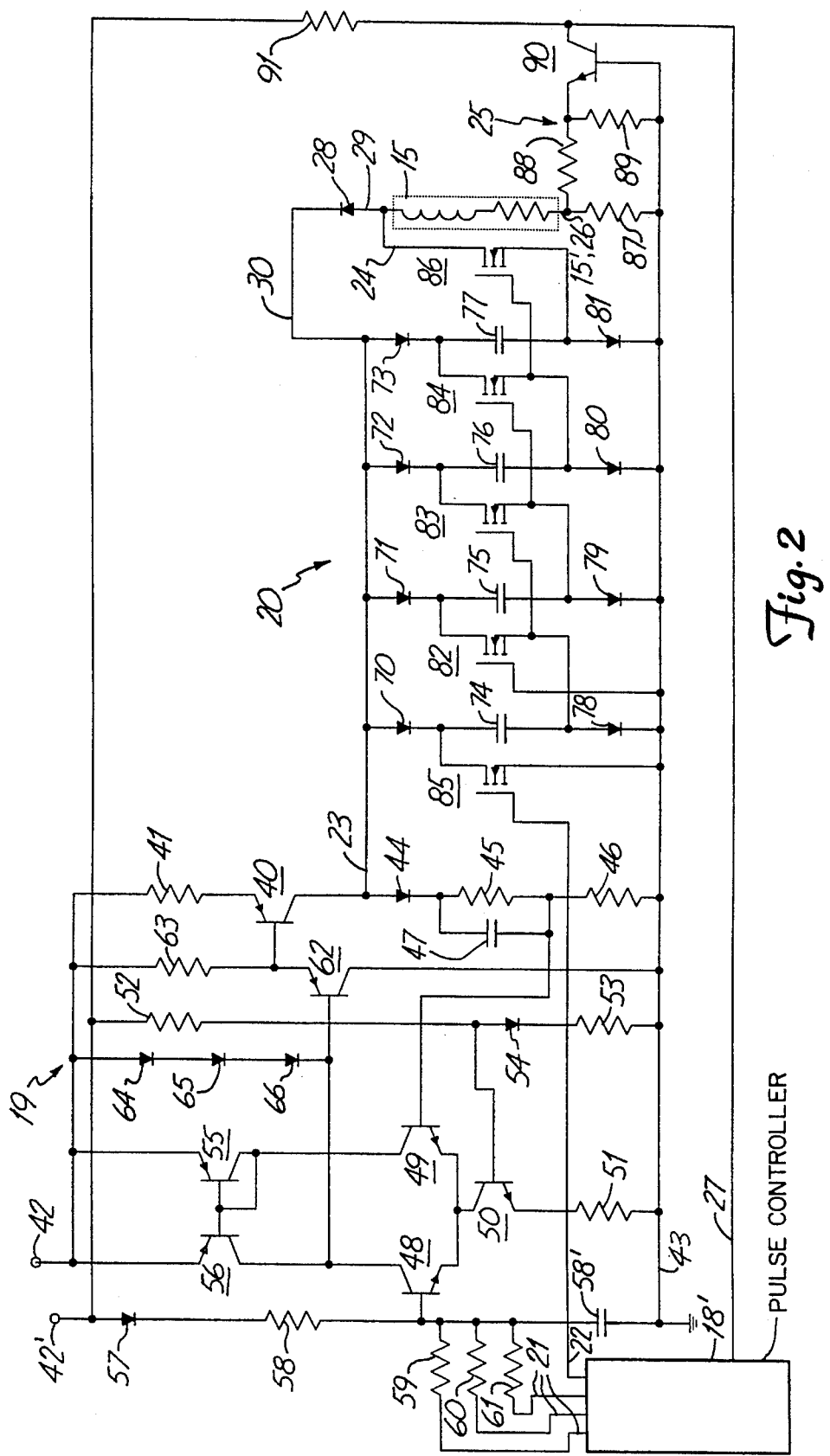
FIG. 2 shows an electrical schematic diagram of a portion of the system of FIG. 1.

FIG. 2 shows a portion of the system in FIG. 1 in greater detail, this detail being presented in the form of an electrical schematic diagram. This schematic diagram is one possible embodiment for some portions of the system of FIG. 1, these portions including magnitude controller 19, pulse former 20, current sensor 25, and energy recoverer 28, all of which are indicated either generally or specifically in FIG. 2. Some of the interconnection designations used in FIG. 1 have also been used in FIG. 2 for similar interconnections.

In addition, pulse controller and receiver 18 of FIG. 1 is indicated only in part in FIG. 2 since none of the circuitry therein based on sensing mid processing a torsion wave in sonic waveguide 15 is presented. That is, the information recovery electronic circuit portions of the system of FIG. 1 are not shown in FIG. 2. As a result, pulse controller and receiver 18 of FIG. 1 is redesignated 18' in FIG. 2 and labeled as a pulse controller only in view of the showing there or only the electronic circuits involved with sonic waveguide current pulse generation in that figure.

Magnitude controller 19 is formed by a controlled, variable output, regulated voltage power supply which transmits not only the information as to the desired magnitude for sonic waveguide electrical current pulses to pulse former 20, but also provides the primary electrical power for those pulses to pulse former 20. Magnitude controller 19 is a feedback based series pass analog voltage regulator having as its series pass element a PNP bipolar transistor, 40. Transistor 40 has a resistor, 41, connected between its emitter and a voltage supply terminal, 42, adapted for connection to a supply of voltage which is typically of a relatively large voltage compared to the electronic circuit supply voltage for operating the rest of the electronic circuitry although it need not be. This remainder of the electronic circuitry is supplied from a further voltage supply terminal, 42', adapted for connection to a source of voltage which would typically be 5.0 volts. A further ground reference terminal, 43, is also adapted for connection to both of those voltage supplies. Resistor 41 is typically a 1.0 Ω value resistor providing some current limiting in the output circuit but small enough to permit rapid charging of the capacitances used in pulse former 20 to be described below.

The collector of transistor 40 serves as the output of the regulated voltage supply, and so is connected to interconnection arrangement 23 as the interconnection to the control signal input of pulse former 20, and also as the charging terminal for the capacitances used in that circuit as just mentioned. Also connected between the collector of transistor 40 and ground reference 43 is a diode, 44, that is further connected in series with a pair of resistors, 45 and 46, these resistors forming a voltage divider. Resistor 45 typically has a value of 4.0 kΩ and resistor 46 typically has a value of 1.0 kΩ. The voltage divider formed by resistors 45 and 46 serve as the feedback network in the voltage regulator along with a differential amplifier to be described below, that amplifier having an input connected to the junction of these two resistors. The ratio of the resistance value of resistor 45 to the sum of the resistance values of resistors 45 and 46 is the approximate gain provided in the feedback network with respect to the reference voltage value appearing at the other input of the error detector differential amplifier. Thus, the gain ratio for this purpose is approximately 5. Diode 44 serves through being reversed biased to isolate the input of the error detector differential amplifier from the sharp negative voltage values which appear on the magnitude control input of pulse former 20 connected to interconnection 23 during the occurrence of an electrical current pulse on waveguide 15. A capacitor, 47, of typically 0.1 μF serves as a bypass around resistor 45 to more quickly couple the voltage recovery on interconnection 23 after terminations of electrical current pulses on sonic waveguide 15 when the voltage thereon returns to positive values to aid the voltage regulator more quickly regain control of its output voltage value.

The error detector differential amplifier is based on a pair of input NPN bipolar transistors, 48 and 49, each having its emitter connected to that of the other, and a current source connected to these emitters to thus form a differential input for the error detector amplifier. The current source is formed of another npn bipolar transistor, 50, having its collector connected to the emitters of transistors 48 and 49, and its emitter connected through a resistor, 51, to ground reference 43. A voltage divider arrangement is provided involving a pair of resistors, 52 and 53, in series with one another but with a diode, 54, connected therebetween, this series arrangement connected between electronic voltage supply terminal 42' and ground reference 43. The base of resistor 50 is connected between resistor 52, connected to terminal 42', and the anode of diode 54 so that the voltage across diode 54 and resistor 53 sets the base voltage of transistor 50 to thereby also set the voltage drop across resistor 51 and, thus, the current drawn in the collector of transistor 50. Diode 54 serves as a temperature compensation diode for compensating the temperature changes in the base-emitter diode of transistor 50. Typical values for resistors 51, 52 and 53 are 100 Ω, 6.2 kΩ, and 1.0 kΩ, respectively.

The collectors of transistors 48 and 49 have a current mirror active load circuit connected thereto formed by a pair of pnp bipolar transistors, 55 and 56. Transistor 55 has its emitter connected to the primary power voltage terminal 42 as does the emitter of transistor of 56. The collector of transistor 55 is connected to the collector of transistor 49, and the collector of transistor 56 is connected to the collector of transistor 48. The bases of transistors 56 and 55 are connected to one another and to the collector of transistor 55 so that the collector current drawn from transistor 55 is essentially duplicated by that drawn from the collector of transistor 56. This arrangement forms a transconductance differential amplifier such that the voltage differential between the bases of transistors 48 and 49 control the current drawn at the output of this amplifier formed by the collectors of transistors 48 and 56 which together determine the current drawn that ultimately controls the current through output pass transistor 40 as will be described below.

The base of transistor 49 is, as indicated, connected to the junction of voltage divider resistors 45 and 46 to sense the fraction of the output voltage present at that junction. The base of the other differential amplifier input transistor 48 is connected to several outputs of pulse controller 18' through corresponding resistors, and to the electronic voltage supply terminal 42' through a corresponding resistor. The connection of the base of transistor 48 to terminal 42' is through a series combination of a diode, 57, and the just mentioned the corresponding resistor, 58, typically of a 2.0 kΩ value. This arrangement allows for the typical 5.0 V on terminal 42' to be applied directly to the base of transistor 48 subject to the actions of pulse controller 18'. A capacitor, 58', connected between the base of transistor 48 and ground reference 43 in series with resistor 58 shunts away electrical noise and has a typical value of 0.01 μF.

Pulse controller 18' has three outputs each connected through one of three corresponding resistors, 59, 60 and 61, which typically have values of 8.0 kΩ, 4.0 kΩ and 2.0 kΩ, respectively. The outputs of pulse controller 18' operate approximately at either 0.0 V low logic state or 5.0 V high logic state, so that with each of them at the high logic state value of 5.0 V, the base of transistor 48 will be at that voltage value also. Pulse controller 18', by changing one or more of those outputs to 0.0 V, will cause a voltage divider to be formed between those resistors having its pulse controller 18' input at 0.0 V and the remaining resistors, the junction of the voltage divider in effect being connected to the base of transistor 48. As a result, pulse controller 18' can select a range of different voltages to be applied to the base of transistor 48 with each such voltage being a selected fractional pail of 5.0 V.

Each of these alternative selected voltage values on the base of transistor 48 forms a reference value for the transconductance differential amplifier such that any deviations from a similar voltage on the base of transistor 49 will result in the output of this amplifier drawing a sufficient current to change the current flowing through pass transistor 40 enough to cause the voltage at junction of resistors 45 and 46 to substantially match that at the base of transistor 48. That is, a feedback loop is provided forcing transistor 40 to permit a sufficient current to flow therethrough such that the voltage at the collector thereof adjusts to result in the voltage at the junction of resistors 45 and 46 matching that at the base of transistor 48. Again, because of the ratio of the resistance value of resistor 45 to the sum of the resistance values of resistors 45 and 46 is greater than one, the voltage at the collector of transistor 40 and at the magnitude control input of pulse former 20 must be sufficiently greater than that at the base of transistor 48 so as to have the voltage divider action of resistors 45 and 46 result in a substantially equal voltage appearing at the base of transistor 49. Diode 57 provides temperature compensation on its side of the differential transconductance error detection amplifier for temperature caused voltage shifts on the other side of that amplifier due to diode 44.

Current drawn at the collector of transistor 48 at the output of the differential transconductance amplifier is supplied by the collector current of active load transistor 56 and the base of a further pnp bipolar transistor, 62, to which this collector is connected. This base current drawn from transistor 62 causes a corresponding current to flow in the emitter circuit thereof through a resistor, 63, connected between the emitter of transistor 62 and primary power voltage terminal 42, this resistor having a typical value of 100 Ω. The emitter current so drawn by transistor 62 substantially also flows in the collector of that transistor connected to ground reference 43. In addition, the emitter current of transistor 62 is partly supplied by the base current of pass transistor 40 with its base circuit effectively in parallel with resistor 63 so that the value of resistor 63 controls the degree of response of transistor 40 to changes in the base current drawn in transistor 62.

However, the amount of base current supplied by transistor 62 is limited by the presence of a series of three diodes, 64, 65 and 66, connected between primary power voltage terminal 42 and the base of transistor 62. These three diodes in series will supply the current drawn by the collector of transistor 48 whenever the voltage drop across resistor 63 plus the emitter-base junction of transistor 62 exceeds three diode drops thus limiting the base current which can be drawn from transistor 62. As a result, transistor 62 provides an additional gain for the operation of past transistor 40 beyond that provided by the differential transconductance amplifier, but only up to a point.

Thus, the voltage value effectively selected by pulse controller 18' to appear at the collector of pass transistor 40, serving as the output of magnitude controller 19, is applied to the magnitude control input of pulse former 20 through interconnection arrangement 23. Interconnection arrangement 23 is a conductor extending from the collector of pass transistor 40 to the input of pulse former 20 formed by the anodes collectively of four diodes, 70, 71, 72 and 73. The cathodes of each of these diodes are each connected to a side of a corresponding one of four capacitors, 74, 75, 76 and 77 each having a typical value of 4.7 µF. The opposite sides of these capacitors are each connected to an anodes of a corresponding one of four further diodes, 78, 79, 80 and 81. The anodes of these latter four diodes are all corrected to ground reference 43.

Each of these circuit branches, having a pair of diodes separated by a capacitor all in series with one another and extending between conductor 23 and ground reference 43, form a charging path in parallel with the others. This arrangement permits the simultaneous charging of these capacitors in parallel by current drawn at the collector of pass transistor 40 until they are charged to the voltage value appearing at that collector. The charging can start rapidly since it is limited only by resistor 41 in the emitter circuit of transistor 40 and the effective resistances of the diodes in each charging branch which are all quite small. However, the collector current from pass transistor 40 is limited to less than 1.0 Amps by the limit on the base current which can be drawn from transistor 62 due to diodes 64, 65 and 66 described above. This limits the collector current of that transistor, and so the base current drawn from transistor 40. This, in turn, limits the collector current of pass transistor 40.

Additionally, three n-channel, enhancement mode MOSFET switching transistors, 82, 83 and 84, are provided in pulse former 20 of Fig. 2 connected between these circuit branches to permit switching into series with one another the capacitors 74, 75, 76 and 77 in those branches after they are charged to thereby generate a resulting voltage substantially equal to the sum of the voltages to which each of the capacitors has been charged. The voltage so generated will thus be a relatively large voltage for application across sonic waveguide 15 to initiate an electrical current pulse therealong. Although four of these circuit branches are shown in the system of FIG. 2 interconnected by switching transistors, more or fewer such branches similarly connected could be selected for use to thereby provide a greater or smaller voltage on the waveguide which will be equal to substantially the sum of the capacitor voltages in the selected number of branches (less the switching transistor "on" condition voltages).

Each of these switching transistors has terminating regions thereof serving as its source and drain connected to an adjacent pair of the parallel circuit branches. One such terminating region is connected between the capacitor and the anode of the diode connected to ground reference 43 in the circuit branch member of that pair closer to magnitude controller 19. The remaining terminating region of that transistor is connected to the remaining circuit branch of that pair between the cathode of the diode thereof connected to interconnection 23 and the capacitor thereof. Thus, each of these switching transistors is connected on the opposite sides of the capacitors in the two circuit branches of that pair.

As an example, transistor 82 has a source terminating region connected between capacitor 74 and diode 78 in the circuit branch closest to magnitude controller 19, and its remaining drain terminating region connected between diode 71 and capacitor 75 in the next adjacent circuit branch closer to sonic waveguide 15. Switching transistors 83 and 84 are similarly arranged between the second and third circuit branches and the third and fourth circuit branches, respectively, counting these circuit branches from magnitude controller 19 toward sonic waveguide 15. After charging the circuit branches in parallel with the switching transistors in the "off" condition, the switching of transistors 82, 83 and 84 into the "on" condition effectively provides capacitors 74, 75, 76 and 77 in series with one another.

This switching of those transistors is accomplished through the use of a further n-channel, enhancement mode MOSFET switching transistor, 85, having its drain terminating region connected to the cathode of diode 70 and the diode capacitor 74 connected thereto, and its source terminating region connected to ground reference 43. The gate of transistor 85 is connected to an output of pulse controller 18' which is capable of switching that gate between 0.0 V and a positive 5.0 V. During charging of the above-described circuit branches by magnitude controller 19, this output of pulse controller 18' is at 0.0 V.

The alternative connection of capacitors 74, 75, 76 and 77 in series with one another is the result of pulse controller 18' changing the voltage at the gate of transistor 85 to approximately 5.0 V. In that situation, transistor 85 goes into the "on" condition bringing the cathode of diode 70 and the side of capacitor 74 connected thereto to approximately the voltage on ground reference 43. This forces the opposite side of capacitor 74 to a voltage below that on ground reference 43 to a value initially equal to that voltage to which that capacitor was previously charged less the "on" condition voltage of transistor 85. This result forces the source of transistor 82 to the below ground voltage on that side of capacitor 74 to which it is connected, as well as reverse biasing diode 78. Since the gate of transistor 82 is connected to ground reference 43, that transistor's gate is strongly positive with respect to its source to thereby switch it to the "on" condition.

As a result, the side of capacitor 75 opposite that connected to the drain of transistor 82 is shifted in voltage to being that which appears at the side of capacitor 74 to which the source of transistor 82 is connected less the "on" condition voltage of transistor 82. Thus, the opposite side of capacitor 75 is below the ground reference potential by approximately the voltages, at least initially, to which both capacitors 74 and 75 were previously charged prior to the switching. Diode 79 is thus strongly reversed biased, and diode 71 forces the voltage at interconnection 23 to drop to the voltage on the side of capacitor 74 to which diode 78 is connected thereby reverse biasing diode 70 as well as diode 44. The voltage on collector of transistor 40 is, of course, also forced negative.

This switching of the switching transistors 82, 83, 84 into conduction then cascades to switch successively each of them into the "on" condition. As indicated, the source of transistor 83 which is connected to the junction of capacitor 75 and diode 79 will initially be at approximately the sum of the initial charging voltages on capacitors 74 and 75 below the ground reference potential with the switching of transistor 82 into the "on" condition. However, the gate of transistor 83, in being connected to the source of transistor 82, is initially below the ground reference potential by only the initial charge on capacitor 74, so that this gate of transistor 83 is strongly positive with respect to the source of that transistor thereby switching it into the "on" condition.

This places, at least initially, the side of capacitor 76 connected to the drain of transistor 83 and the cathode of diode 72 at the sum of the initial charging voltages of capacitors 74 and 75 below the ground reference potential and reverse biases diode 71. This forces the opposite side of capacitor 76 connected to the anode of diode 80 to initially being approximately the sum of the initial charging voltage values of capacitors 74, 75 and 76 below the potential at ground reference 43 (ignoring the "on" voltages of transistors 85, 82 and 83) and reverse biasing diode 80.

Since the source of switching transistor 84 is connected to the junction of capacitor 76 and the anode of diode 80, this source is also forced initially to being at three capacitor initial charging voltage values below the potential on ground reference 43. The gate of transistor 84, in being connected to the source of transistor 83, is only two capacitor initial charging voltage values below the potential on ground reference 43 so that transistor 84 is also strongly switched into the "on" condition. This initially forces the junction of the cathode of diode 73 and capacitor 77 to a potential equal to the sum of the initial charging voltages on capacitors 74, 75 and 76 below the potential on ground reference 43 (again ignoring the on voltages of transistors 85, 82, 83 and 84) resulting in the reverse biasing of diode 72. The opposite side of capacitor 77 is thereby forced initially to a potential substantially equal to the sum of the initial charging voltages on capacitors 74, 75, 76 and 77 below the potential on ground reference 43 and reverse biasing diode 81.

This last potential at the anode of diode 81 is also the initial potential on the source of the further n-channel, enhancement mode MOSFET switching transistor, 86. Switching transistor 86 then connects sonic waveguide 15 (represented by a "lumped" inductance and resistance in FIG. 2)to capacitors 74, 75, 76 and 77 connected in series since the gate of that transistor is connected to the source of transistor 84 to thereby initially be only three capacitor initial charging voltage values below the potential on ground reference 43 resulting in transistor 86 being strongly switched into the "on" condition. The drain of transistor 86 is also connected to interconnection 23 through a further diode serving as energy recoverer 28. As a result of the potential applied to the anode of diode 28 by the sum of the initial voltages on capacitors 74, 75, 76 and 77 after charging, diode 28 will be reversed biased as will diode 73.

The voltage thus initially applied to sonic waveguide 15, the sum of the voltages of which capacitors 74, 75, 76 and 77 are initially charged less the "on" condition voltages of the various switching transistors, will result in a substantial discharge current from these capacitors connected in series flowing through ground reference 43 through a reference resistor, 87, and through sonic waveguide 15. Such a current can continue to flow until capacitors 74, 75, 76 and 77 are sufficiently discharged, or until pulse controller 18' switches the voltage on the gate of transistor 85 back to approximately 0.0 V. Upon either of such events, the various switching transistors will be forced into the "off" condition to thus terminate the current flow to complete the current pulse on sonic waveguide 15, and the circuit branches can then be recharged by magnitude controller 19 through the collector of transistor 40.

Once the electrical current pulse applied by the series combination of previously charged capacitors 74, 75, 76 and 77 has terminated, the distributed inductance of sonic waveguide 15 (shown by an equivalent "lumped" inductance) will have a substantial amount of magnetic energy stored in the magnetic field thereabout as indicated above. This energy can in part be recovered by the connecting of the anode of the energy recoverer diode 28 to sonic waveguide 15 at the end thereof at which the current pulse is initiated, and connecting the cathode of that diode to interconnection 23 or the input of pulse former 20. Upon cessation of the application of the sum of the voltages in these pulse former capacitors 74, 75, 76 and 77 to the waveguide, the field around the inductances of the waveguide begins collapsing and thereby provides a current to interconnection 29 in a forward direction through diode 28 and through interconnection 30 to partially recharge these capacitors. This charge applied to these capacitors represents charge which does not have to be supplied through the collector of transistor 40 in magnitude controller 19 and therefore improves the energy efficiency of the system shown in FIG. 2.

As described above, there is usually a desire to have the electrical current pulse initiated on sonic waveguide 15 reach a particular magnitude, but to not exceed that magnitude. In addition, the peak pulse magnitude is desired to last only a selected time duration. Forming such a pulse is a challenge because the sonic waveguides themselves must be of different lengths to be used in different instrumentation situations in which relative translation distance is to be measured, e.g. measuring liquid surface depths in tanks of various vertical sizes. The difference in lengths of sonic waveguides 15 in different instruments means that the electrical parameters faced by the current pulsing circuitry will differ when used with different waveguides in view of the typical waveguide having distributed inductance and resistance over its length to yield a total effective inductance and total effective resistance that depends on that length. That is, the inductance of a typical waveguide might accumulate, for example, at approximately 0.3 $\mu$H/in, and the resistance at the rate of 0.2 $\Omega$/in. for some particular waveguide structure. Of course, sonic waveguides of different constructions and materials can be used which will result in an even wider range of electrical parameters will be faced.

The greater the total effective inductance, the longer the time to have the current reach a particular magnitude value for a given magnitude voltage step applied to an end of the waveguide, and so the voltage step magnitude must be adjusted if the current magnitude is to reach the desired magnitude value in a selected time duration. This can be accomplished in the system of FIG. 2 by varying the voltage to which capacitors 74, 75, 76 and 77 are initially charged by magnitude control 19, and by having pulse controller 18' terminate the applied voltage pulse at a suitable time duration after initiation thereof.

This switching off of the current pulse can be accomplished by providing a current sensor to monitor the current magnitude value reached on sonic waveguide 15, and to provide some indication of that magnitude to either pulse controller 18', for the purpose of allowing that controller to switch transistor 85 into the "off" condition after the initiation of a current pulse therethrough, or to a circuit provided in the system responsive to the current sensor to switch transistor 85 into the "off" condition. The system in FIG. 2 is based on the former arrangement, that is, having a current sensor provide an indication of the current magnitude on sonic waveguide 15 to pulse controller 18'.

Current sensor 25 of FIG. 1 is shown to the far right in FIG. 2, and is based on measuring the current flowing through reference resistor 87, typically a 1.0 Ω resistor. This resistor is across a voltage divider typically formed of a pair of 100 Ω resistors, 88 and 89, connected between ground reference 43 and return wire 15' from sonic waveguide 15 over interconnection 26. The junction of resistors 88 and 89 is connected to the emitter of an NPN bipolar transistor, 90, having its base connected to ground reference 43. The collector of transistor 90 is connected through a further resistor, 91, with a typical value of 4.7 kΩ to the electronic voltage supply terminal 42'. This collector is also connected to an input of pulse controller 18'.

Transistor 90 is in the "off" condition in the absence of a current through reference resistor 87 sufficient to cause the voltage appearing at the junction of transistors 88 and 89 and the emitter of transistor 90 to be sufficiently negative to switch transistor 90 into the "on" condition. Once sufficient current is flowing through resistor 87, transistor 90 will be switched onto the "on" condition thereby changing the voltage at its collector, and so at the input of pulse controller 18', from the 5.0 V on terminal 42' to approximately −0.7 V. Choosing the values of resistors 87, 88 and 89 properly allows the selection of the current flowing through reference resistor 87 that will be sufficiently large to switch transistor 90 into the "on" condition to thereby inform pulse controller 18' that the desired peak magnitude current has been reached.

Current sensor 25 is used in preliminary calibration, or the forming of preliminary set up data, prior to use of the relative distance measuring instrument in a selected application. If the set up data is stored in a nonvolatile memory, the preliminary calibration or preliminary set up data collection can be accomplished before the use of the instrument in the desired application, including being done at the point of manufacture rather than at the point of application. The following description of the preliminary calibration process, or set up data collection process, assumes that pulse controller 18' has an electrically erasable electrically programmable read only memory (EEPROM) available therein for storing such data. Furthermore, the description assumes that the instrument is initially provided in some calibration test fixture or other arrangement as appropriate for the calibration process.

Figure 3B:
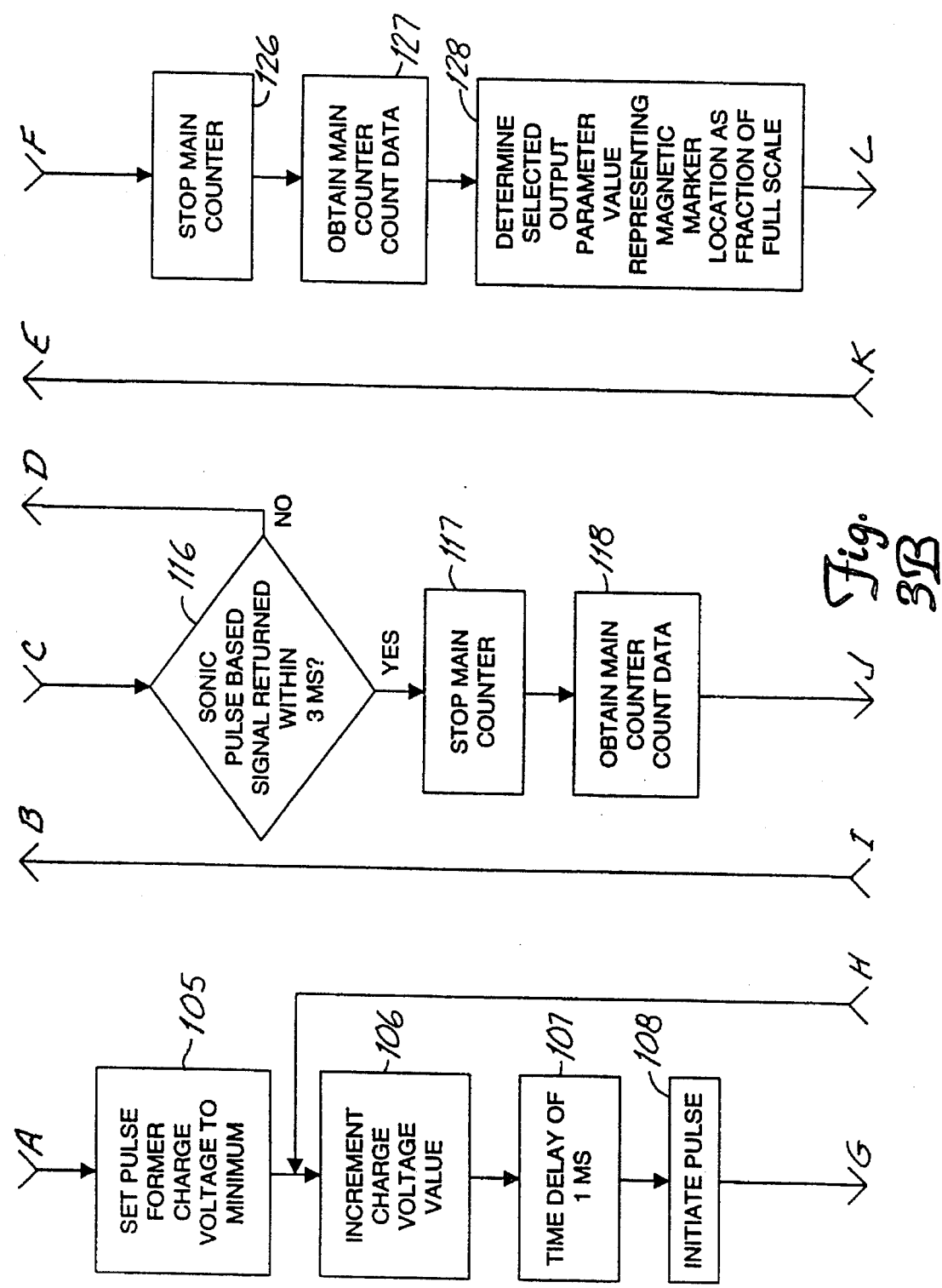

FIG. 3 is a flow chart typically followed by pulse controller and receiver 18 in operating the system shown in FIGS. 1 and 2. Upon start of the operation indicated by a start balloon, 100, when marker magnet 31 is first placed at the far end of sonic waveguide 15, or enclosure 14, away from housing 12 as indicated in a further box, 101, in FIG. 3. Thereafter, the system is electrically powered ("powered up"), but controller and receiver 18 delays 100 ms before undertaking control actions to thereby allow transients to settle in the system, etc. as indicated in the following box, 102.

Once such settling has been accomplished and pulse controller and receiver 18 has taken control of the system shown in FIGS. 1 and 2, that controller awaits the receipt of a command to either go through the preliminary calibration process, or set up data collection process, as one alternative or, if that process has previously been accomplished, to proceed directly to operating the instrument in its application. Thus, controller and receiver 18 checks an externally supplied command as to whether it is to operate the system in the automatic test set up or calibration mode, or whether it is to operate the system in the application mode, or relative translation distance measurement mode, as is indicated in a decision diamond, 103. If this calibration command appears, the central processing unit in the microcomputer in pulse controller and receiver 18 is initialized by placing appropriate values in the registers thereof for operating in the automatic test set up mode as indicated in a box, 104.

Thereafter, magnitude controller 19 is set by pulse controller 18' to charge capacitors 74, 75, 76 and 77 in pulse former 20 to the minimum possible charging voltage for the system through the provision of suitable controller output voltage values on the controller outputs to which resistors 59, 60 and 61 are connected in FIG. 2 as indicated in another box, 105. The voltage value on these resistors is then incremented one step to the next largest voltage value as indicated in a box, 106, and, after a time delay of 1 ms indicated in a box, 107, pulse controller 18' initiates an electrical current pulse on sonic waveguide 15 by switching transistor 85 into the "on" condition as indicated in a further box, 108.

Once an electrical current pulse has been initiated on sonic waveguide 15, current sensor 25 monitors the current in that waveguide to determine whether the magnitude thereof has reached a selected value through determining whether a threshold voltage on current sensor 87 representing the desired current has been reached. If not, as indicated by the feedback path from decision diamond 109 to the path ahead of box 106, pulse controller 18' increments the voltage to which magnitude controller 19 charges capacitors 74, 75, 76 and 77 in pulse former 20 to the next larger voltage, and initiates a further current pulse on sonic waveguide 15. This continues until current sensor 25 detects the desired peak electrical current pulse magnitude as having occurred on sonic waveguide 15 for the particular waveguide involved. Once that current pulse magnitude peak is detected, the voltage setting needed by pulse controller 18' from magnitude controller 19 to achieve that magnitude is stored in the EEPROM as indicated in a subsequent box, 110.

After the proper voltage value has been found to which magnitude controller 19 is to charge capacitors 74, 75, 76 and 77 in pulse former 20 to achieve the desired magnitude electrical current pulse on sonic waveguide 15, the comparator in pulse controller and receiver 18 used to detect signals based on the corresponding return torsion pulse from sonic waveguide 15 is set to its maximum, or least sensitive, value as indicated in a further box, 111. This is the basis for the next calibration test, or next step in the set up data collection process, in setting the threshold value of that comparator properly for the particular waveguide involved, and for determining the length of that waveguide which is also to be retained in pulse controller and receiver 18.

The return torsion pulse on sonic waveguide 15 corresponding to a transmitted electrical current pulse is detected through its causing motion in a magnetostrictive and permeable material structure appended to that waveguide. The resulting change in magnetic flux thereabout is sensed by a coil and sent to electronic signal processing circuitry which includes the comparator just mentioned as a basis for determining whether a sonic pulse signal has arrived or not.

The time between the sending of the electrical current pulse and the return of the torsion pulse is a measure of where magnetic marker 31 is along sonic waveguide 15 which, as indicated above, has for purposes of the preliminary calibration or set up data collection testing been placed at the far end of that waveguide.

Once the signal processing comparator for detecting received torsion pulse based signals has been set to its least sensitive setting, that threshold value is decremented by a step to the next least sensitive value available therefor as indicated in a further box, 112. Thereafter, a time delay of 1 ms is allowed to settle transients in the electronic system during which the main counter in pulse controller and receiver 18, used for counting clock pulses in a clock supplied time base signal, is reset. This main counter is initiated to begin such counting upon the initiation of a current pulse on sonic waveguide 15, and stopped from further such counting upon the return of a torsion pulse on sonic waveguide 15 to thus provide the torsion pulse travel time on sonic waveguide 15. This time delay and resetting is indicated in another box, 113.

Upon completion of the 1 ms delay, pulse controller and receiver 18 initiates an electrical current pulse in sonic waveguide 15 as indicated in a further box, 114, coincidentally with initiating counting in the main counter shown in a further box 115. Pulse controller and receiver 18 monitors sonic waveguide 15 for up to 3.0 ms as indicated in the decision diamond, 116, for the corresponding torsion pulse return, this pulse due to the interaction of the magnetic field of the electrical current pulse on sonic waveguide 15 and the magnetic field of magnetic marker 31 at the end of sonic waveguide 15. No waveguide is expected to be so long as to require a wait for return torsion pulse longer than 3.0 ms in the system of FIGS. 1 and 2, but one could be constructed of a great length thereby requiring the system to be adjusted to await such a return for time longer than 3.0 ms. In the absence of such a return in that time period, the feedback loop from decision diamond 116 to the path ahead of box 112 indicates that a further decrement in the threshold value is made and, after a suitable time delay and resetting of the main counter, another electrical current pulse is initiated on the waveguide with the main counter also started coincidentally. Pulse controller and receiver 18 again monitors for a torsion pulse return for 3.0 ms. This continues until such time the threshold has been reduced sufficiently for such a return pulse to be detected by pulse controller and receiver 18.

At that point, a further box, 117, indicates the main counter has stopped so that the count therein represents the number of clock time periods elapsing from the time that counter was started and the current pulse initiated until the main counter was stopped on the return of the corresponding torsion pulse. That is, the count represents the elapsed time for the torsion pulse to return from magnetic marker 31 to the detection circuitry in housing 12 and pulse controller and receiver 18. Pulse controller and receiver 18 obtains this count data in the main counter as indicated in a further box, 118, and stores that count data in the EEPROM as indicated in subsequent box, 119. Such data allows the pulse controller and receiver 18 to infer the length of the waveguide on the basis of magnetic marker 31 having been positioned at the far end of transducer 11 and the time required for the torsion pulse to travel therefrom to the detector circuitry in housing 12. Also saved in the EEPROM is the value of the threshold setting at which the return torsion pulse was detected to thereby set that threshold to the proper sensitivity for the particular waveguide involved, this saving indicated in a further box, 120.

The steps to this point complete the preliminary calibration testing, or set up data collection processing, thereby leaving the relative translational distance measuring system or instrument ready for use in its planned application whatever it may be. Such application use requires removing the instrument from the test arrangement and positioning it in its application arrangement followed by electrically powering it as indicated in another box, 121. When it is so powered up, pulse controller and receiver 18 obtains the set up data stored in the EEPROM and stores it in its appropriate operating registers, as indicated in another box, 122. After resetting the main counter as indicated in further box, 123, pulse controller 18' initiates a current pulse on sonic waveguide 15 and initiates the main counter as indicated on yet another box, 124.

Pulse controller and receiver 18 await the corresponding sonic torsion pulse to be returned on sonic waveguide 15 as indicated in a further decision diamond, 125, and the feedback path therearound. Once such a torsion pulse has been detected, the main counter is stopped as indicated in a further box, 126. The count data so accumulated is obtained by pulse controller and receiver 118 as indicated in another box, 127, and used to determine the value of a selected output parameter chosen to represent the location of magnetic marker 31 along sonic waveguide 15 and enclosure 14 in transducer 11. The output parameter selected could be an analog signal such as voltage or some other analog variable, or it could be a digital signal in some digital numbering system or an encoded version thereof. Pulse controller and receiver 18 will then scale the counted data based on having the maximum measurement distance of magnetic marker 31 along sonic waveguide 15 represented by the full scale value for that selected parameter, and will convert it to an equivalent value for that parameter if needed. The output parameter value resulting from such scaling then represents the fraction of the full scale of the output parameter value that is equal to the fraction of the waveguide maximum measurable extent represented by the distance to the location of magnetic marker 31 along the waveguide. This is indicated in a further box, 128, in FIG. 3.

The value so found for the relative translation distance of magnetic marker 31 along sonic waveguide 15 is then transmitted to the output of system 10 as indicated in a further box, 129. Thereafter, a synchronization time is allowed for differences in output data times due to differences on transducer lengths and magnetic marker positions indicated in a final box, 130, and the process of sending another electrical pulse to obtain current measurement data is begun again as indicated by the feedback path from box 130 to just ahead of box 122.

As indicated above, an alternative to the system shown in FIG. 2 for obtaining the proper duration of the electrical current pulse is to use the output signal from current sensor 25 to directly terminate the electrical current pulse wherein provided by pulse forming 20 rather than having pulse controller and receiver 18 do so during the preliminary calibration testing or set up data collection processing. One modification of the system shown in FIG. 2 to accomplish this result is shown in the system depicted in the electrical schematic diagram of FIG. 4. Those components in the system of FIG. 4 which are essentially as those used in the system of FIG. 2 retain the same designations in FIG. 4 they had in FIG. 2.

Figure 4:
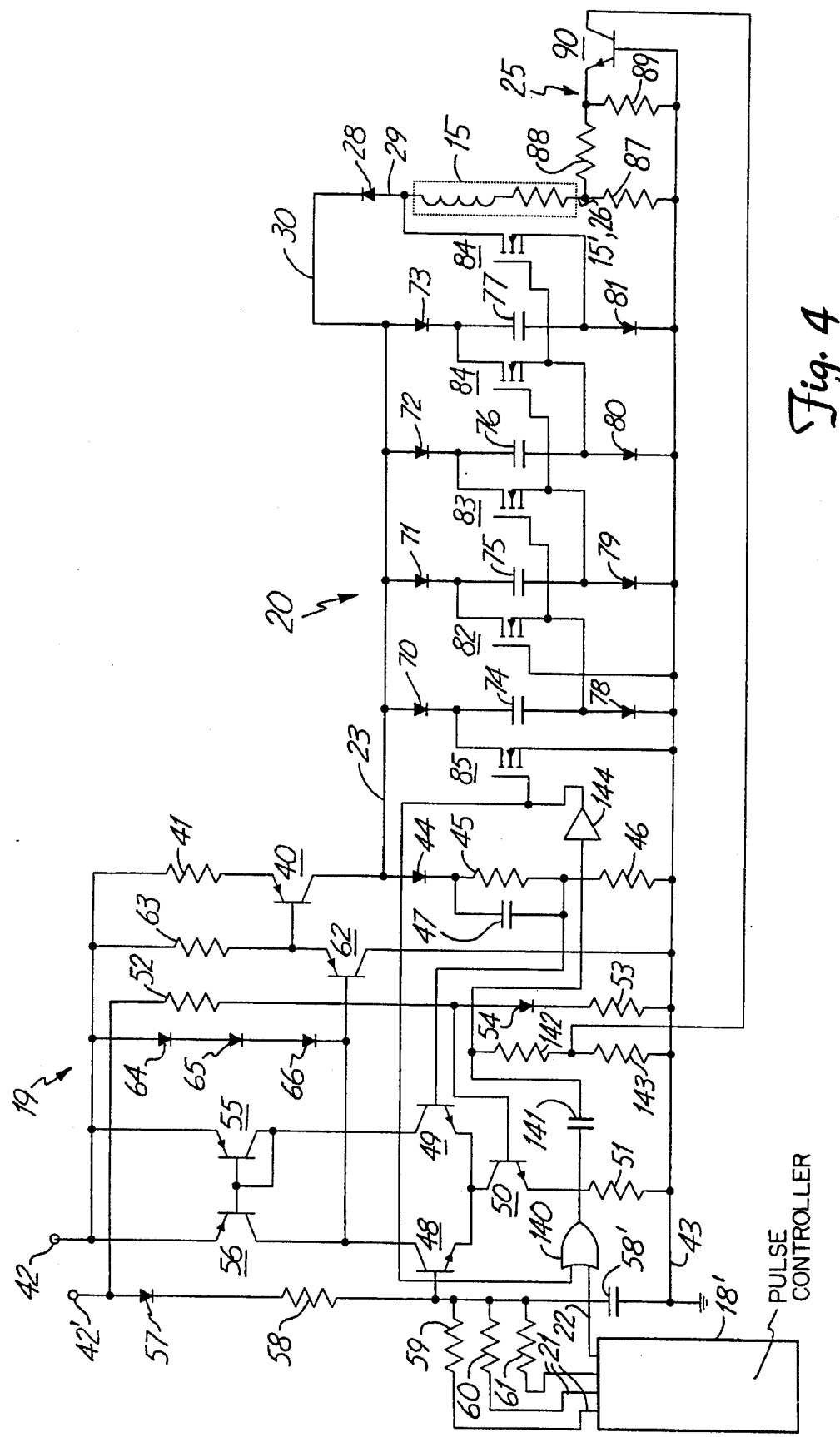
FIG. 4 shows an alternate embodiment of the system portion shown in FIG. 2.

In the system of FIG. 4, the collector of transistor 90 in current sensor 25 is not connected to an input of pulse controller of 18' as in the system of FIG. 2, but instead is connected in a supplementary circuit through which pulse controller 18' operates transistor 85. This supplementary circuit is a monostable multivibrator providing an output pulse which, if unaffected by external circuitry, will have a duration long enough to provide the maximum duration desired electrical pulse on sonic waveguide 15.

The monostable multivibrator is formed with an OR logic gate, 140, having an input electrically connected to an output of pulse controller 18' at which that controller provides an initial short duration initiation pulse to the monostable multivibrator circuit at times selected to initiate an electrical current pulse on sonic waveguide 15. Although not shown, gate 140 is also connected between electronic voltage supply terminal 42' and ground reference 43. The output of OR logic gate 140 is connected to a capacitor, 141, of a magnitude selected to provide the duration wanted in the output voltage pulse of the monostable multivibrator circuit. The opposite side of capacitor 141 is connected to one end of a voltage divider formed by a pair of resistors, 142 and 143, connected between capacitor 141, as just stated, and ground reference 43. In addition, that same side of capacitor 141 and end of this voltage divider are also connected to the input of a buffer logic gate, 144, which again, though not shown, is also connected between electronic voltage supply terminal 42' and ground reference 43. An output of buffer logic gate 144 is connected to the gate of switching transistor 85, and also fed back to connect to another input of OR logic gate 140.

In operation, pulse controller 18' initiates an electric current pulse on sonic waveguide 15 by providing a short duration positive voltage pulse to that input of OR logic gate 140 to which it is connected. As a result, the output of gate 140 rises to the positive voltage representing the higher logic state thereof, this voltage then appearing across the voltage divider formed by resistors 142 and 143 and decreasing as capacitor 141 is charged. At the same time, this voltage appears at the input of buffer logic gate 144 causing its output to rise to the positive voltage representing a high logic state in that device. This output voltage from buffer logic gate 144 is sufficient to switch switching transistor 85 into the "on" condition to thereby initiate an electrical current pulse on sonic waveguide 15.

At the same time, this high logic gate voltage at the output of buffer logic gate 144 is also applied to the input of OR logic gate 140 to which it is connected. This occurs prior to the termination of the pulse provided by pulse controller 18' on the other input of OR logic gate 140 with the result that the termination of the controller pulse does not effect the voltage of the output of OR logic gate 140. The high logic state voltage present there due to the controller initiation pulse is maintained because of the voltage subsequently applied on the input of that gate connected to the output of buffer logic gate 144°. As a result, the, monostable multivibrator circuit remains in the state with a high logic state voltage at the outputs of both OR logic gate 140 and buffer logic gate 144 until capacitor 141 charges sufficiently to reduce the voltage across the voltage dividers formed by resistors 142 and 143 to thereby result in the output voltage of buffer logic gate 144 being insufficient to keep transistor 85 switched into the "on" condition or, more normally, until current sensor 25 supplies a small negative voltage pulse from the collector of transistor 90 to the junction of resistors 142 and 143 signifying that the desired current pulse peak magnitude has been reached.

Upon the occurrence of such a negative voltage pulse on the collector of transistor 90, the junction of capacitor 141, resistor 142, and the input of buffer logic gate 144 is quickly pulled to a value sufficiently low to force the output of that gate to a sufficiently low value to switch off switching transistor 85 and OR logic gate 140, and thus terminate the electrical current pulse on sonic waveguide 15. Since the precalibration process has assured that the electrical current pulse on sonic waveguide will reach the desired magnitude, the normal shut off mode for the electrical current pulse on that waveguide is the sensing of this magnitude by current sensor 25 with the resulting termination of the monostable state of the multivibrator followed by the switching into the "off" condition of transistor 85.

Turning to pulse former 20 of FIGS. 2 and 4, alternative configurations are possible, a pair of which are shown in FIGS. 5 and 6 although they are not directly substitutable in the systems as FIGS. 2 and 4. The reason for this lack of direct substitutability is that these circuits provide positive electrical current pulses on sonic waveguide 15 rather than the negative electrical current pulse provided by the embodiment of pulse former 20 shown in FIGS. 2 and 4. Furthermore, FIGS. 5 and 6 show other alternatives available differing from the pulse former shown in FIGS. 2 and 4. These include the use of p-channel, enhancement mode MOSFET devices, the use of resistors rather than diodes in forming the parallel charging branch circuits, the connection of the charging branch circuits to internal nodes in others of such circuits rather than all being connected in parallel between the power supply and the ground reference, and the connection of many of the switching circuits to a common node.

Again, only four charging circuit branches each with a single capacitor are shown in the circuits of FIGS. 5 and 6 to give a voltage increase of approximately 4 times the initial charging voltage of those capacitors. Nevertheless, either fewer or more such capacitor stages could be used to change the multiplier to a value smaller or greater than the number 4. Also, circuit arrangements for current sensor 25 have been omitted in the circuits represented in the electrical schematic diagrams of FIGS. 5 and 6 but can easily be provided similarly to those shown in the circuits of FIGS. 2 and 4. This is also true of the energy recoverer used in the circuits of FIGS. 2 and 4.

Considering now the circuit of FIG. 5, four capacitors, 150, 151, 152, and 153, are shown in an alternative pulse former, 20', interconnected to one another by various resistors. Capacitor 150 is connected through a resistor 154 to the electrical power source therefor represented by interconnection 23. The opposite side of capacitor 150 is connected to ground reference 43. Thus, in the absence of any conduction by the switching transistors in this circuit, capacitor 150 is charged through resistor 154 prior to initiating an electrical current pulse on sonic waveguide 15.

Capacitor 151 is connected by a resistor, 155 to the junction of resistor 154 and capacitor 150 on one side thereof, and is connected by resistor, 156, to ground reference 43 on the other side thereof. Here, in the absence of conduction by the switching transistors to be described below, capacitor 151 is charged through resistors 154, 155 and 156 prior to the initiation of any electrical current pulse on sonic waveguide 15.

Capacitor 152 is connected on one side thereof by resistor, 157, to the junction of capacitor 151 and resistor 155. The opposite side of capacitor 152 is connected by a resistor, 158, to resistor 156. As a result, capacitor 152 is charged through resistors 154, 155, 157, 158 and 156 in the absence of conduction by the switching transistors prior to the initiation of an electrical current pulse on sonic waveguide 15.

Finally, capacitor 153 has one side thereof connected by a resistor, 159, to the junction of capacitor 152 and resistor 157. The opposite side of capacitor 153 is connected by resistor, 160, to resistor 158. Here, prior to conduction by the switching transistors to initiate an electrical current pulse of sonic waveguide 15, capacitor 153 is charged through all of the resistors so far described in the circuit FIG. 5.

In this circuit arrangement, the charging circuit branches overlap one another in each using, other than the first branch, the resistors from the previous branch circuit therein. These overlapped branches sharing the resistors of the previous branch are each connected between the pulse former 20' input, which is the end of resistor 154 connected to interconnection 23, and ground reference 43, and so can be viewed as being charged in parallel when the switching transistors to be described below are in the "off" condition.

Alternatively, independent circuit branches are found in this circuit which do not share components but which also do not connect between just two points. Interior circuit branches can be viewed as being formed by an interior capacitor, either of capacitors 151 or 152, with a resistor on either side thereof. The remaining exterior capacitors are then involved in exterior circuit branches each having a single resistor and series therewith to form two component branches. In the interconnection of the circuit branches to one another, adjacent circuit branches are connected in a staggered manner so that the interior circuit branches are connected to one another by having a junction at the end of one connected to an intermediate connection point between components in the other. The exterior branches are then interconnected to an intermediate connection point in the nearest interior branch and again connected together at the branch junctions at one end of each.

In either view, three p-channel, enhancement mode MOSFET devices, 161, 162 and 163, are then used as switching devices in pulse former 20' to effectively connect adjacent branches together to thereby provide capacitors 150, 151, 152 and 153 in series with one another so that the sum of the voltages to which they are initially charged is applied across sonic waveguide 15 in much the same manner as in pulse former 20. Each of these switching transistors is connected between adjacent circuit branches in either view and on the opposite sides of the capacitors in each. That is, the switching transistor has one of its terminating regions connected to the side of the capacitor nearest the power supply in one branch, and has the other connected into the side of the capacitor nearest ground reference 43 in the other branch.

Thus, transistor 161 has its source connected to the junction of capacitor 150 and resistor 154, and its drain connected to the junction of capacitor 151 and resistors 156 and 158. Transistor 162 has its source connected to the junction of capacitor 151 and resistors 155 and 157, and its drain connected to the junction of capacitor 152 and resistors 158 and 160. Similarly, transistor 163 has its source connected to the junction of capacitor 152 and resistors 157 and 159, and its drain connected to the junction of capacitor 153 and resistor 160.

A further p-channel, enhancement mode MOSFET device, 164 is then used to connect the series capacitor string occurring after switching across sonic waveguide 15. The source of transistor 164 is connected to the junction of capacitor 153 and resistor 159, and the drain thereof is connected to sonic waveguide 15. In each instance, the gate of each of transistors 162, 163 and 164 is connected to the source of the preceding transistor so as to assure that gate will always be connected to a node in the circuit which is more negative than that node to which the source of that transistor is connected once the switching has taken place to assure that these switching transistors are switched strongly into the "on" condition. The gate of switching transistor 161 is again connected either to pulse controller 18', or to a monostable multivibrator along the lines indicated above by an arrangement which results in the initiation pulse being a negative going voltage pulse.

In the absence of a current sensor and an energy recovering arrangement, a discharge circuit branch is provided for sonic waveguide 15 formed of a resistor, 165, and a diode, 166, connected in series across that waveguide. This discharge circuit allows the magnetic energy accumulated in the effective inductance of sonic waveguide 15 to discharge at the termination of an electrical current pulse. A further description of the operation of the circuit of FIG. 5 need not be undertaken here as its sequence of operation is much like that of pulse former 20 in FIGS. 2 and 4.

FIG. 6 shows a further alternative embodiment where the pulse former, here designated 20", is particularly useful when the threshold voltages of the switching transistors are relatively high relative to the voltage supplied at interconnection 23 for initially charging capacitors 150, 151, 152 and 153. The circuit in FIG. 6, except for the input circuitry to be described, is like that shown in FIG. 5 so that components common to each retain the same designation in each.

The input triggering circuit in FIG. 6 comprises a further resistor, 170, connected to interconnection 23 on one side thereof, and on the other side thereof to the anode of a diode, 171, the collector of an npn bipolar transistor, 172, and to the gates of switching transistors 161, 162 and 163. The cathode of diode 171 is connected to a capacitor, 173, and the initiation input of pulse former 20". The other side of capacitor 173 is connected to the emitter of transistor 172, and to a resistor, 174, having its opposite end connected to ground reference terminal 43. The base of transistor 172 is connected through a parallel circuit to ground reference terminal 43, the parallel circuit comprising a further resistor, 175, with a further capacitor, 176, thereacross.

In operation, during the initial charging of capacitors 150, 151, 152 and 153 prior to the provision of an electrical current pulse on sonic waveguide 15, capacitor 173 is also charged to the power supply voltage through resistor 170, diode 171 and resistor 174. Transistor 172 is strongly switched into the "off" condition in this charging circumstance as its emitter will be at a higher voltage than its base. Once charging is complete, a grounding of the trigger circuit input will force the cathode of diode 171 to ground bringing the gates of switching transistor 161, 162 and 163 along. The charging capacitor 173 will force the emitter of transistor 172 to a negative voltage value equal to the voltage initially stored on capacitor 173 thereby switching transistor 172 into the "on" condition and reverse biasing diode 171. Thus, the gates of transistors 161, 162 and 163 will be jointly forced to a negative voltage to switch these transistors into the "on" condition thereby initiating an electrical current pulse on sonic waveguide 15.

Although the present invention has been described with reference to preferred embodiments, workers skilled in the art will recognize that changes may be made in form and detail without departing from the spirit and scope of the invention.

What is claimed is:

1. A current pulse generation system for generating current pulses on an electrical pulse conductor, said current pulse generation system comprising:

a variable magnitude pulse former having a magnitude control input, a pulse initiation input, and an output electrically connected to said pulse conductor, said variable magnitude current pulse former being capable of forming a current pulse at said output thereof upon an initiation signal being provided to said initiation input thereof with said current pulse having a magnitude substantially determined by a magnitude control signal provided at said magnitude control input thereof;

a magnitude control signal generator having an input, and having an output electrically connected to said variable magnitude pulse former magnitude control input, said magnitude control signal generator providing a signal at said output thereof having a magnitude determined by a signal applied to said input thereof;

a current pulse magnitude sensor having an input electrically connected to said pulse conductor and having an output, said current pulse magnitude sensor providing an output signal on said output thereof indicative of magnitudes reached by current pulses occurring on said pulse conductor; and a pulse controller having an input electrically coupled to said current pulse magnitude sensor output, a selection output electrically connected to said magnitude control signal generator input, and an initiation output electrically connected to said variable magnitude pulse former initiation input, said pulse controller being capable of providing initiation signals on selected occasions of selected magnitudes on said initiation output thereof.

2. The system of claim 1 wherein said variable magnitude pulse former further has a recovery input and said pulse conductor is capable of storing energy thereabout if an electrical current pulse is transmitted therealong, said system further comprising an energy recoverer having an input electrically connected to said pulse conductor and having an output electrically connected to said variable magnitude pulse former recovery input, said energy recoverer being capable of recovering at least a portion of that energy stored in said pulse conductor as a result of a current pulse being transmitted therealong.

3. The system of claim 1 wherein said variable magnitude pulse former comprises:

a plurality of branch circuit portions each having at least one electrical impedance electrically connected through an intermediate connection means in series with an electrical capacitance between a first branch junction and a second branch junction with a selected one of said first branch junction and said intermediate connection means of at least one of said branch circuit portions being electrically connected to said magnitude control input, said first branch junction of each of said branch circuit portions being electrically connected to a selected one of said first branch junction and said intermediate connection means of at least one other of said branch circuit portions, said second branch junction of each of said branch circuit portions being electrically connected to a selected one of said second branch junction and said intermediate connection means of at least one other of said branch circuit portions;

a plurality of switching devices including a first switching device each having first and second terminating regions and a control region therein by which such switching device is capable of being directed to effectively provide a conductive path of a selected conductivity between its first and second terminating regions, said first switching device first and second terminating regions each being electrically connected to a corresponding one of a pair of said branch circuit portions at a said intermediate connection means therein so as to have one of these said terminating regions connected between said first branch junction and said electrical capacitance of one branch circuit portion of said pair and that remaining one of these terminating regions connected between said electrical capacitance and said second branch junction of that other branch circuit portion remaining in said pair; and a pulse initiation transferor having an input electrically coupled to said pulse initiation input and an output electrically coupled to a selected one of said switching device control regions and said branch circuit portions, said pulse initiation transferor being capable of supplying a switching signal at said output thereof in response to receiving an initiation signal at said input thereof directing that an electrical pulse be provided at said generator output, said first switching device control region being electrically coupled to a selected one of said pulse initiation transfer output and said branch circuit portions.

4. The system of claim 1 wherein said magnitude control signal generator is formed by a regulated voltage supply having a regulated voltage output serving as said magnitude control signal generator output, and having a variable reference value input serving as said magnitude control signal generator input, said regulated voltage supply having an energization input adapted for connection to a supply of voltage.

5. The system of claim 1 wherein said current pulse magnitude sensor has a sensing resistance connected to said input thereof to be in series with said pulse conductor, and has a voltage sensor provided across said sensing resistance having an output connected to said current pulse magnitude sensor output.

6. The system of claim 1 wherein said pulse controller is capable of terminating a said initiation signal after receipt of a said current pulse magnitude sensor output signal to thereby terminate a corresponding current pulse at said output of said pulse former.

7. The apparatus of claim 1 wherein said pulse controller is capable of providing a magnitude control signal at said selection output thereof of a selected value.

8. The system of claim 1 wherein said pulse conductor provides a current pulse transmitted therealong also along a sonic waveguide.

9. The system of claim 2 wherein said energy recoverer is a diode.

10. The apparatus of claim 3 wherein said electrical impedance is a selected one of a diode and a resistive impedance.

11. An electrical pulse generator having an energization input adapted for connection to a source of electrical energy, and having a pulse initiation input and having an output, said generator comprising:

a plurality of branch circuit portions each having at least one electrical impedance electrically connected through an intermediate connection means in series with an electrical capacitance between a first branch junction and a second branch junction with a selected one of said first branch junction and said intermediate connection means of at least one of said branch circuit portions being electrically to said energization input, said first branch junction of each of said branch circuit portions being electrically connected to a selected one of said first branch junction and said intermediate connection means of at least one other of said branch circuit portions, said second branch junction of each of said branch circuit portions being electrically connected to a selected one of said second branch junction and said intermediate connection means of at least one other of said branch circuit portions;

a plurality of switching devices including a first switching device each having first and second terminating regions and a control region therein by which such switching device is capable of being directed to effectively provide a conductive path of a selected conductivity between its first and second terminating regions, said first switching device first and second terminating regions each being electrically connected to a corresponding one of a pair of said branch circuit portions at a said intermediate connection means therein so as to have one of these said terminating regions connected between said first branch junction and said electrical capacitance of one branch circuit portion of said pair and that remaining one of these terminating regions connected between said electrical capacitance and said second branch junction of that other branch circuit portion remaining in said pair; and a pulse initiation transferor having an input electrically coupled to said pulse initiation input and an output electrically coupled to a selected one of said switching device control regions and said branch circuit portions, said pulse initiation transferor being capable of supplying a switching signal at said output thereof in response to receiving an initiation signal at said input thereof directing that an electrical pulse be provided at said generator output, said first switching device control region being electrically coupled to a selected one of said pulse initiation transferor output and said branch circuit portions.

12. The apparatus of claim 11 wherein a second switching device in said plurality of switching devices has its first and second terminating regions each being electrically connected to a corresponding one of a pair of said branch circuit portions at a said intermediate connection means therein such as to be so connected between said first branch junction and said capacitance of one and between said capacitance and said second branch junction of that other remaining in said pair, said second switching device control region being electrically coupled to a said intermediate connection means in a corresponding one of said branch circuit portions.

13. The apparatus of claim 11 wherein a second switching device in said plurality of switching devices has its first and second terminating regions each being electrically connected to a corresponding one of a pair of said branch circuit portions at a said intermediate connection means therein such as to be so connected between said first branch junction and said capacitance of one and between said capacitance and said second branch junction of that other remaining in said pair, said second switching device control region being electrically coupled to said pulse initiation transferor output.

14. The apparatus of claim 11 wherein said pulse initiation transferor is a direct interconnection.

15. The apparatus of claim 11 wherein said pulse initiation transferor a pulse adaptor capable of providing an electrical pulse at said output thereof differing from that pulse occurring in said initiation signal provided at said input thereof.

16. The apparatus of claim 11 wherein said electrical impedance is a resistive impedance.

17. The apparatus of claim 11 wherein said electrical impedance is a diode.

18. The apparatus of claim 12 wherein each of said control regions of said plurality of switching devices other than said first switching device is electrically connected to a terminating region of another of said switching devices.

19. The apparatus of claim 13 wherein each of said control regions of each said plurality of switching devices other than said first switching device is electrically connected to said pulse initiation transferor output.

20. The apparatus of claim 18 wherein any particular switching device in said plurality thereof other than said first switching device has its control region electrically connected to a said terminating region of that said switching device having its other terminating region electrically connected by a said electrical capacitance to a terminating region of that said particular switching device.

21. A current pulse generation system for generating current pulses on an electrical pulse conductor, said current pulse generation system comprising:

an electrical current charging source adapted for connection to a supply of electrical energy and having an output;

a pulse forming circuit having an output and having an input electrically connected to said charging source output, said pulse forming circuit further comprising:
a plurality of capacitors; and
a plurality of switches electrically connected with said capacitors in said plurality thereof so as to be able to switch each said capacitor between being charged in parallel with those other said capacitors in said plurality thereof from said pulse forming circuit input to being electrically connected in series with those other said capacitors in said plurality thereof and with said pulse forming circuit output;

an electrical load electrically connected to said pulse forming circuit output and capable of storing electrical energy therein; and an energy recoverer connected between said electrical load and said pulse forming circuit and capable of accommodating transfers of at least some of any electrical energy stored in said load to said pulse forming circuit.

22. The apparatus of claim 21 wherein said plurality of capacitors are connected in parallel from said pulse forming circuit input with one side thereof oriented toward, and that remaining side oriented away, from said pulse forming circuit input, and wherein said switches are transistor devices interconnected between adjacent ones of said plurality of capacitors connected as aforesaid so as to have one terminal of each said transistor device electrically connected on a side of a capacitor oriented toward said pulse forming circuit input but another terminal of that said transistor device connected on a side of an adjacent capacitor oriented away from said pulse forming circuit input.

23. The apparatus of claim 21 wherein said energy recoverer is a diode electrically connected between said electrical load at said pulse forming circuit output and said pulse forming circuit input.

* * * * *

UNITED STATES PATENT AND TRADEMARK OFFICE
CERTIFICATE OF CORRECTION

PATENT NO. : 5,587,680
DATED : DECEMBER 24, 1996
INVENTOR(S) : STEPHEN W. SMITH

It is certified that error appears in the above-indentified patent and that said Letters Patent is hereby corrected as shown below:

Col. 1, line 29, delete "imitiation", insert --initiation--

Col. 3, line 19, delete "13o", insert --13.--

Col. 4, line 33, delete "mid", insert --and--

Col. 6, line 32, delete "pail", insert --part--

Col. 15, line 28, delete "0R", insert --OR--

Signed and Sealed this

Twenty-fifth Day of March, 1997

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,587,680
DATED : DECEMBER 24, 1996
INVENTOR(S) : STEPHEN W. SMITH

It is certified that error appears in the above-indentified patent and that said Letters Patent is hereby corrected as shown below:

Col. 1, line 29, delete "imitiation", insert --initiation--

Col. 3, line 19, delete "13o", insert --13.--

Col. 4, line 33, delete "mid", insert --and--

Col. 6, line 32, delete "pail", insert --part--

Col. 15, line 26, delete "0R", insert --OR--

This certificate supersedes Certificate of Correction issued March 25, 1997.

Signed and Sealed this

Twentieth Day of May, 1997

Attest:

BRUCE LEHMAN

Attesting Officer

Commissioner of Patents and Trademarks